(12) United States Patent
Kim et al.

(10) Patent No.: US 9,589,950 B2
(45) Date of Patent: Mar. 7, 2017

(54) DISPLAY APPARATUS

(71) Applicant: Samsung Display Co., Ltd., Yongin, Gyeonggi-Do (KR)

(72) Inventors: Kyunho Kim, Cheonan-si (KR); Sung-In Kang, Hwaseong-si (KR); Woojin Lee, Asan-si (KR)

(73) Assignee: Samsung Display Co., Ltd. (KR)

( * ) Notice: Subject to any disclaimer, the term of this patent is extended or adjusted under 35 U.S.C. 154(b) by 138 days.

(21) Appl. No.: 14/684,007

(22) Filed: Apr. 10, 2015

(65) Prior Publication Data

US 2016/0148922 A1     May 26, 2016

(30) Foreign Application Priority Data

Nov. 24, 2014 (KR) .......... 10-2014-0164596

(51) Int. Cl.
*H02H 9/00* (2006.01)
*H01L 27/02* (2006.01)
*G02F 1/1362* (2006.01)
*G09G 3/32* (2016.01)
*G09G 3/36* (2006.01)
(Continued)

(52) U.S. Cl.
CPC .... *H01L 27/0255* (2013.01); *G02F 1/136204* (2013.01); *G09G 3/3266* (2013.01); *G09G 3/3674* (2013.01); *H01L 27/0248* (2013.01); *H01L 27/0266* (2013.01); *H01L 27/0288* (2013.01); *H01L 29/866* (2013.01); *H02H 7/20* (2013.01); *G09G 2300/043* (2013.01); *G09G 2300/0426* (2013.01); *G09G 2310/0267* (2013.01); *G09G 2310/0286* (2013.01); *G09G 2330/04* (2013.01); *G09G 2330/06* (2013.01); *G09G 2330/08* (2013.01)

(58) Field of Classification Search
USPC .......................... 361/56; 349/40, 54
See application file for complete search history.

(56) References Cited

U.S. PATENT DOCUMENTS

2009/0102995 A1* 4/2009 Kim .............. H01L 27/0248
349/40
2010/0315400 A1   12/2010 Choi et al.
(Continued)

OTHER PUBLICATIONS

EP 15195552.3 Search Report dated Apr. 19, 2016 (9 pages).

*Primary Examiner* — Danny Nguyen
(74) *Attorney, Agent, or Firm* — Innovation Counsel LLP (57) ABSTRACT

A display apparatus includes a timing controller configured to output a gate control signal through gate control lines, a gate driver configured to output gate signals in response to the gate control signal provided from the gate control lines, pixels configured to receive data voltages in response to the gate signals, and first and second static electricity prevention parts connected to the gate control lines in parallel configured to discharge a static electricity. Each of the first and second static electricity prevention parts is configured to form current paths, which are smaller in number than a number of the gate control lines, to discharge the static electricity and the static electricity configured to be discharged by the first static electricity prevention part has a polarity different from a polarity of the static electricity configured to be discharged by the second static electricity prevention part.

20 Claims, 5 Drawing Sheets

(51) Int. Cl.
*H01L 29/866* (2006.01)
*H02H 7/20* (2006.01)

(56) References Cited

U.S. PATENT DOCUMENTS

| | | | |
|---|---|---|---|
| 2013/0106811 A1* | 5/2013 | Hirabayashi | G02F 1/136204 345/204 |
| 2013/0250201 A1 | 9/2013 | Kobashi | |
| 2014/0340380 A1 | 11/2014 | Song et al. | |

* cited by examiner

DISPLAY APPARATUS

CROSS-REFERENCE TO RELATED APPLICATION

This U.S. non-provisional patent application claims priority under 35 U.S.C. §119 of Korean Patent Application No. 10-2014-0164596, filed on Nov. 24, 2014, the contents of which are hereby incorporated by reference in its entirety.

BACKGROUND

1. Field of Disclosure

The present disclosure relates to a display apparatus. More particularly, the present disclosure relates to a display apparatus capable of preventing a control line and a gate driver from being damaged due to a static electricity and capable of reducing a manufacturing cost thereof.

2. Description of the Related Art

In general, a display apparatus includes a display panel including pixels to display image, a gate driver to apply gate signals to the pixels, a data driver to apply data voltages to the pixels, and a timing controller to control the gate driver and the data driver.

The gate driver outputs the gate signals in response to a gate control signal provided from the timing controller. The data driver outputs the data voltages in response to a data control signal provided from the timing controller.

The gate control signal is applied to the gate driver through gate control lines connected to and between the timing controller and the gate driver. When the gate control lines are damaged by a static electricity, the gate control signal is not applied to the gate driver. In addition, when the static electricity is applied to the gate driver through the gate control line, elements included in the gate driver are damaged.

SUMMARY

The present disclosure provides a display apparatus capable of preventing a control line and a gate driver from being damaged due to a static electricity.

The present disclosure provides a display apparatus capable of reducing a manufacturing cost thereof.

Embodiments provide a display apparatus including a timing controller configured to output a gate control signal through a plurality of gate control lines, a gate driver configured to output gate signals in response to the gate control signal provided from the gate control lines, a plurality of pixels configured to receive data voltages in response to the gate signals, and first and second static electricity prevention parts connected to the gate control lines in parallel configured to discharge a static electricity. Each of the first and second static electricity prevention parts is configured to four current paths, which are smaller in number than a number of the gate control lines, to discharge the static electricity and the static electricity configured to be discharged by the first static electricity prevention part has a polarity different from a polarity of the static electricity configured to be discharged by the second static electricity prevention part.

The first static electricity prevention part is configured to discharge the static electricity having a positive polarity.

The first static electricity prevention part includes a first diode part connected to the gate control lines, a first static electricity prevention circuit connected to the first diode part, and a second static electricity prevention circuit connected to the first diode part. An anode terminal of the first diode part is connected to the gate control lines, and a cathode terminal of the first diode part is connected to the first and second static electricity prevention circuits.

The first diode part includes a plurality of first diode units connected to the gate control lines and the first and second static electricity prevention circuits. An anode electrode of each of the first diode units is connected to a corresponding gate control line among the gate control lines, and a cathode electrode of each of the first diode units is connected to the first and second static electricity prevention circuits.

The first static electricity prevention circuit includes a first capacitor including a first electrode connected to the cathode terminal of the first diode part and a second electrode connected to a first ground and a first transistor including a gate electrode connected to the first ground, a drain electrode connected to the cathode electrode of the first diode part, and a source electrode connected to a second ground.

The first capacitor has a capacitance smaller than about 2.2 nF.

The first transistor includes an n-type field effect transistor.

A size of a ground line connected to the first ground is smaller than a size of a ground line connected to the second ground.

The first and second grounds are connected to a same ground terminal.

The second static electricity prevention circuit includes a second diode unit and a third diode unit. An anode electrode of the second diode unit is connected to the cathode terminal of the first diode part, a cathode electrode of the second diode unit is connected to a cathode electrode of the third diode unit, and an anode electrode of the third diode unit is connected to the second ground.

Each of the second and third diode units includes a zener diode.

The gate control signal has a voltage level smaller than a zener voltage of the zener diode.

The second static electricity prevention part is configured to discharge the static electricity having a negative polarity.

The second static electricity prevention part includes a second diode part connected to the gate control lines, a third static electricity prevention circuit connected to the second diode part, and a fourth static electricity prevention circuit connected to the second diode part. An anode terminal of the second diode part is connected to the third and fourth static electricity prevention circuits, and a cathode terminal of the second diode part is connected to the gate control lines.

The second diode part includes a plurality of fourth diode units connected to the gate control lines and the third and fourth static electricity prevention circuits. An anode electrode of each of the fourth diode units is connected to the third and fourth static electricity prevention circuits, and a cathode electrode of each of the fourth diode units is connected to a corresponding gate control line among the gate control lines.

The third static electricity prevention circuit includes a second capacitor including a first electrode connected to the anode terminal of the second diode part and a second electrode connected to a first ground and a second transistor including a gate electrode connected to the first ground, a drain electrode connected to the anode terminal of the second diode part, and a source electrode connected to a second ground.

The second capacitor has a capacitance smaller than about 2.2 nF.

The second transistor includes a p-type field effect transistor.

The fourth static electricity prevention circuit includes a fifth diode unit and a sixth diode unit. An anode electrode of the fifth diode unit is connected to the anode terminal of the second diode part, a cathode electrode of the fifth diode unit is connected to a cathode electrode of the sixth diode unit, and an anode electrode of the sixth diode unit is connected to a second ground.

Each of the fifth and sixth diode units includes a zener diode.

According to the above, the display apparatus prevents the control line and the gate driver from being damaged due to the static electricity and reduces the manufacturing cost thereof.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this application belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be explained in detail with reference to the accompanying drawings.

Figure 1:
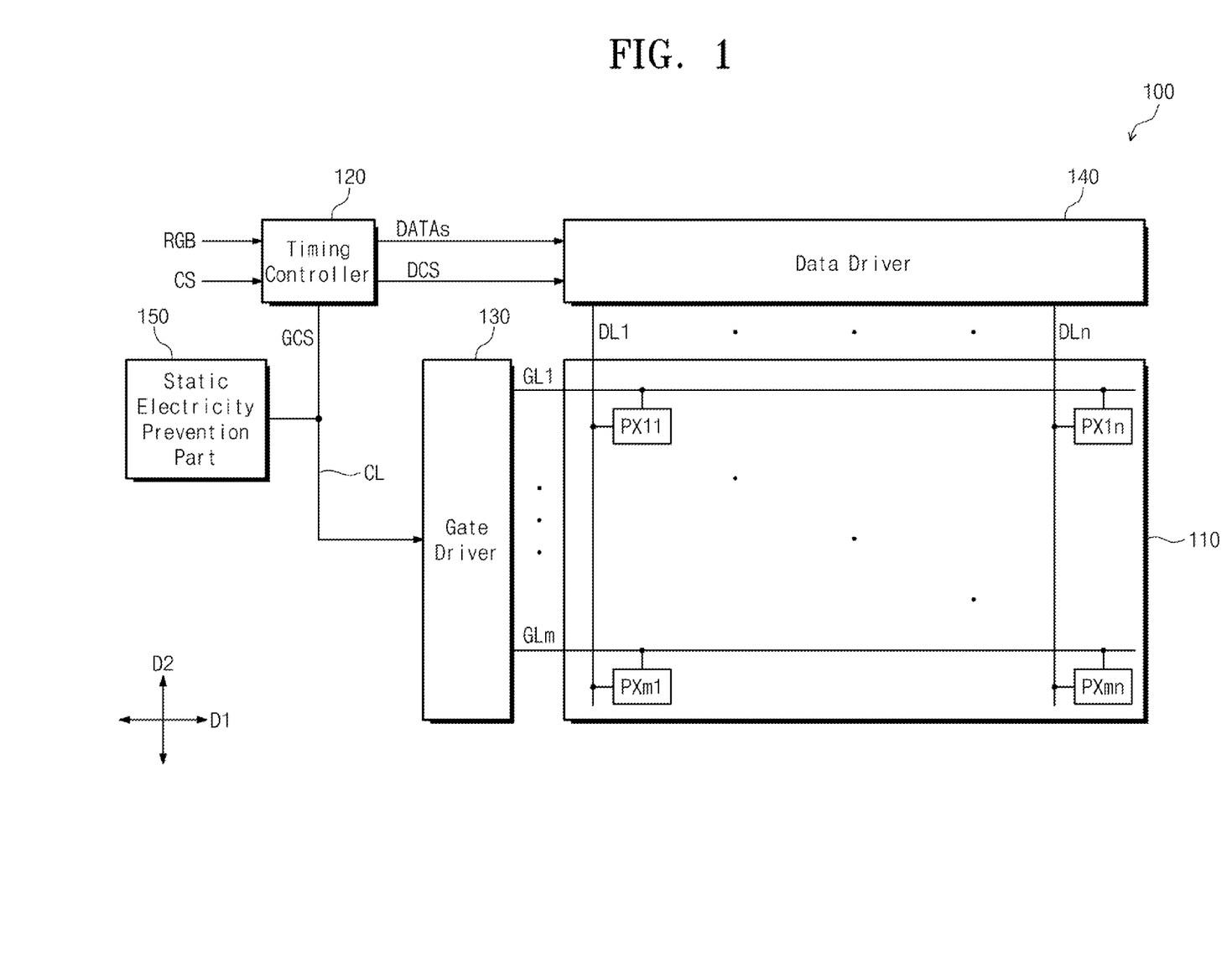
FIG. 1 is a block diagram showing a display apparatus according to an exemplary embodiment of the present disclosure.

FIG. 1 is a block diagram showing a display apparatus 100 according to an exemplary embodiment of the present disclosure.

Referring to FIG. 1, the display apparatus 100 includes a display panel 110, a timing controller 120, a gate driver 130, a data driver 140, and a static electricity prevention part 150.

The display panel 110 includes a plurality of gate lines GL1 to GLm, a plurality of data lines DL1 to DLn, and a plurality of pixels PX11 to PXmn.

The gate lines GL1 to GLm extend in a first direction D1 and are connected to the gate driver 130. The data lines DL1 to DLn extend in a second direction D2 crossing the first direction D1 and are connected to the data driver 140. Each of "m" and "n" is a natural number.

The pixels PX11 to PXmn are arranged in areas defined in association with the gate lines GL1 to GLm and the data lines DL1 to DLn crossing the gate lines GL1 to GLm. Accordingly, the pixels PX11 to PXmn are arranged in a matrix form.

Each of the pixels PX11 to PXmn is connected to a corresponding gate line of the gate lines GL1 to GLm and a corresponding data line of the data lines DL1 to DLn. Each pixel PX11 to PXmn displays one of primary colors. The primary colors include red, green, blue, and white colors, but they should not be limited thereto or thereby. That is, the primary colors may further include yellow, cyan, and magenta colors.

The tuning controller 120 receives image signals RGB and a control signal CS from an external source, e.g., a system board. The timing controller 120 converts a data format of the image signals RGB to a data format appropriate to an interface between the data driver 140 and the timing controller 120 to generate image data DATAs and applies the image data DATAs to the data driver 140.

The timing controller 120 generates a gate control signal GCS and a data control signal DCS in response to the control signal CS. The gate control signal GCS is used to control an operation timing of the gate driver 130. The data control signal DCS is used to control an operation timing of the data driver 140.

The timing controller 120 applies the gate control signal GCS to the gate driver 130 and applies the data control signal DCS to the data driver 140.

A control line CL is connected to and between the timing controller 120 and the gate driver 130. The gate control signal GCS output from the timing controller 120 is applied to the gate driver 130 through the control line CL.

The gate driver 130 generates gate signals in response to the gate control signal GCS. The gate driver 130 sequentially outputs the gate signals. The gate signals are applied to the pixels PX11 to PXmn through the gate lines GL1 to GLm in the unit of row.

The data driver 140 generates data voltages, which are in analog form, corresponding to the image data DATAs in response to the data control signal DCS. The data voltages are applied to the pixels PX11 to PXmn through the data lines DL1 to DLn.

The pixels PX11 to PXmn receive the data voltages provided through the data lines DL1 to DLn in response to the gate signals provided through the gate lines GL1 to GLm. The pixels PX11 to PXmn display grayscale levels corresponding to the data voltages, and thus a desired image is displayed through the display panel 110.

The static electricity prevention part 150 is connected to the control line CL transmitting the gate control signal GCS. The static electricity prevention part 150 discharges a static electricity applied thereto through the control line CL. The static electricity prevention part 150 will be described in detail later.

The timing controller 120 is mounted on a printed circuit board (not shown) in an integrated circuit chip form and connected to the gate driver 130 and the data driver 140.

The gate driver 130 and the data driver 140 are provided in separate driving chips, mounted on a flexible printed circuit board (not shown), and connected to the display panel 110 in a tape carrier package (TCP) scheme, but they should not be limited thereto or thereby.

That is, the gate driver 130 and the data driver 140 provided in separate driving chips may be mounted on the display panel 110 in a chip on glass (COG) scheme. In addition, the gate driver 130 may be substantially simultaneously formed with transistors of the pixels PX11 to PXmn and mounted on the display panel 110 in ASG (amorphous silicon TFT gate driver circuit) form.

Figure 2:
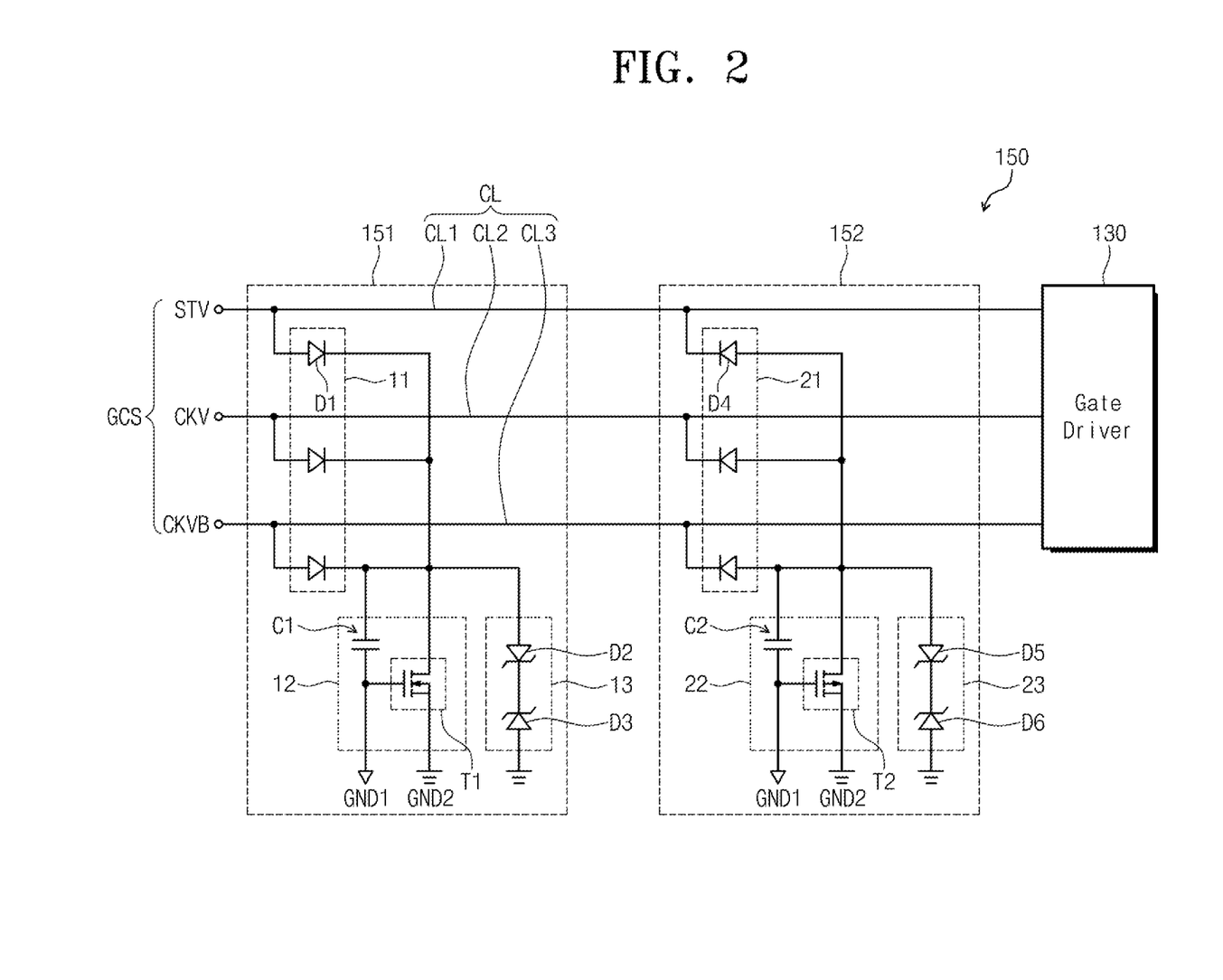
FIG. 2 is a circuit diagram showing a static electricity prevention part shown in FIG. 1.

FIG. 2 is a circuit diagram showing the static electricity prevention part 150 shown in FIG. 1.

Referring to FIG. 2, the control line CL includes a plurality of gate control lines CL1, CL2, and CL3 connected to and between the timing controller 120 and the gate driver 130. The gate control lines CL1, CL2, and CL3 receive the gate control signal GCS from the timing controller 120 and apply the gate control signal GCS to the gate driver 130.

The gate control signal GCS includes a vertical start signal STV a first clock signal CKV and a second clock signal CKVB. The gate control lines CL1, CL2, and CL3 include a first gate control line CL1 applied with the vertical start signal STV, a second gate control line CL2 applied with the first clock signal CKV, and a third gate control line CL3 applied with the second clock signal CKVB.

FIG. 2 shows three gate control lines CL1, CL2, and CL3 respectively applied with the three gate control signals STV, CKV, and CKVB, but the number of the gate control lines. CL1, CL2, and CL3 should not be limited to three. The number of the gate control lines CL1, CL2, and CL3 is determined depending on the number of the gate control signals.

The static electricity prevention part 150 includes a first static electricity prevention part 151 and a second static electricity prevention part 152, which are connected to the gate control lines CL1, CL2, and CL3 to discharge the static electricity.

The first static electricity prevention part 151 discharges a positive static electricity and the second static electricity prevention part 152 discharges a negative static electricity.

The first static electricity prevention part 151 includes a first diode part 11, a first static electricity prevention circuit 12, and a second static electricity prevention circuit 13. The first diode part 11 is connected to the gate control lines CL1, CL2, and CL3 and the first and second static electricity prevention circuits 12 and 13 in a forward direction.

In detail, an anode terminal of the first diode part 11 is connected to the gate control lines CL1, CL2, and CL3. A cathode terminal of the first diode part 11 is connected to the first and second static electricity prevention circuits 12 and 13.

The first diode part 11 includes a plurality of first diode units D1 connected to the gate control lines CL1, CL2, and CL3 and the first and second static electricity prevention circuits 12 and 13 in the forward direction.

An anode electrode of each of the first diode units D1 is connected to a corresponding gate control line of the gate control lines CL1, CL2, and CL3 and a cathode electrode of each of the first diode units D1 is connected to the first and second static electricity prevention circuits 12 and 13.

The first static electricity prevention circuit 12 includes a first capacitor C1 and a first transistor T1, which are commonly connected to the cathode terminal of the first diode part 11.

The first capacitor C1 includes a first electrode connected to the cathode electrodes of the first diode units D1 and a second electrode connected to a first mound GND1. The first transistor T1 includes a gate electrode connected to the first ground GND1 a drain electrode connected to the cathode electrodes of the first diode units D1, and a source electrode connected to a second ground GND2.

The first capacitor C1 has a capacitance smaller than about 2.2 nF. The first transistor T1 includes an n-type field effect transistor.

The second static electricity prevention circuit 13 includes second and third diode units D2 and D3. An anode electrode of the second diode unit D2 is connected to the cathode electrodes of the first diode units D1. A cathode electrode of the second diode unit D2 is connected to a cathode electrode of the third diode unit D3. An anode electrode of the third diode unit D3 is connected to the second ground GND2. Each of the second and third diode units D2 and D3 includes a zener diode.

Although not shown in figures, the first and second grounds GND1 and GND2 are connected to the same ground terminal respectively through different ground lines, and thus the first and second grounds GND1 and GND2 receive the same ground voltage. In addition, a size of the ground line, to which the first ground GND1 is connected, is smaller than a size of the ground line, to which the second ground GND2 is connected.

The second static electricity prevention part 152 includes a second diode part 21, a third static electricity prevention circuit 22, and a fourth static electricity prevention circuit 23. The second diode part 21 is connected to the gate control lines CL1, CL2, and CL3 and the third and fourth static electricity prevention circuits 22 and 23 in a reverse direction.

In detail, an anode terminal of the second diode part 21 is connected to the third and fourth static electricity prevention circuits 22 and 23. A cathode terminal of the second diode part 21 is connected to the gate control lines CL1, CL2, and CL3.

The second diode part 21 includes a plurality of fourth diode units D4 connected to the gate control lines CL1, CL2, and CL3 and the third and fourth static electricity prevention circuits 22 and 23 in the reverse direction.

An anode electrode of each of the fourth diode units D4 is connected to the third and fourth static electricity prevention circuits 22 and 23 and a cathode electrode of each of the fourth diode units D4 is connected to a corresponding gate control line of the gate control lines CL1, CL2, and CL3.

The third static electricity prevention circuit 22 includes a second capacitor C2 and a second transistor T2, which are commonly connected to the anode terminal of the second diode part 21.

The second capacitor C2 includes a first electrode connected to the anode electrodes of the fourth diode units D4 and a second electrode connected to the first ground GND1. The second transistor T2 includes a gate electrode connected to the first ground GND1, a drain electrode connected to the anode electrodes of the fourth diode units D4 and a source electrode connected to the second ground GND2.

The second capacitor C2 has a capacitance smaller than about 2.2 nF. The second transistor 12 includes a p-type field effect transistor.

The fourth static electricity prevention circuit 23 includes fifth and sixth diode units D5 and D6. An anode electrode of the fifth diode unit D5 is connected to the anode electrodes of the fourth diode units D4. A cathode electrode of the fifth diode unit D5 is connected to a cathode electrode of the sixth diode unit D6. An anode electrode of the sixth diode unit D6 is connected to the second ground GND2. Each of the fifth and sixth diode units D5 and D6 includes a zener diode.

Figure 3:
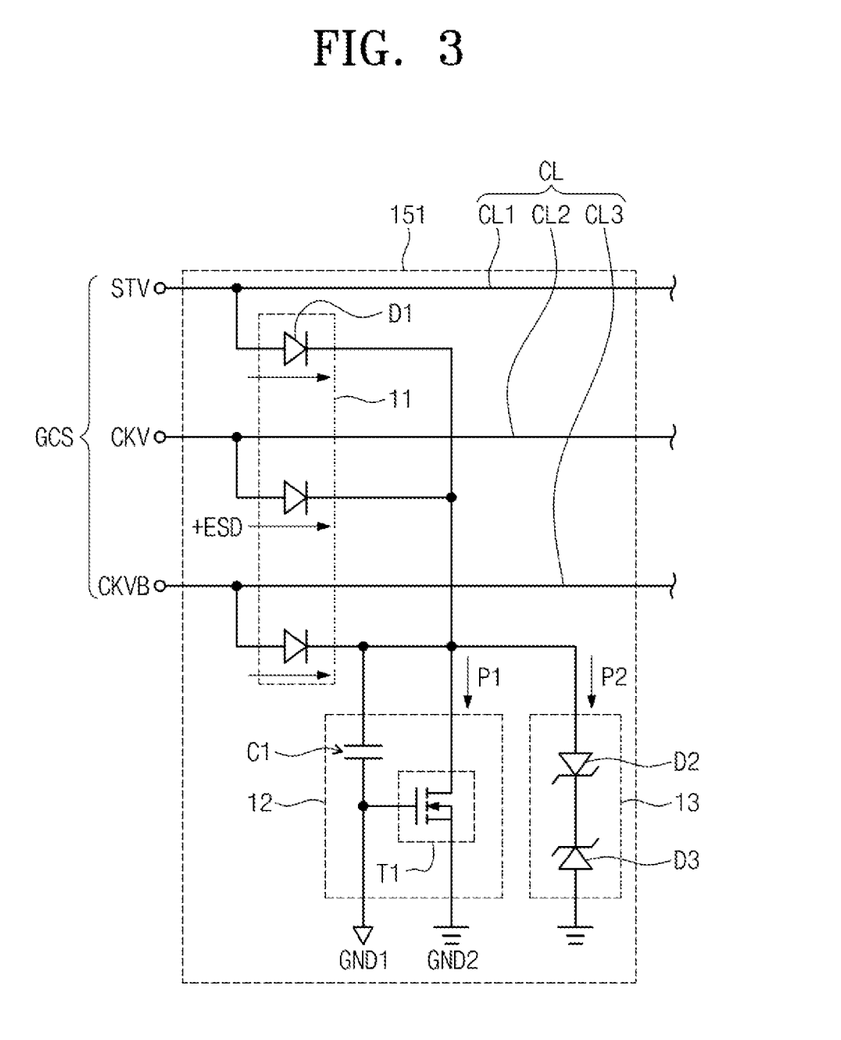
FIG. 3 is a circuit diagram showing an operation of a first static electricity prevention part when a positive static electricity is applied to gate control lines.
Figure 4:
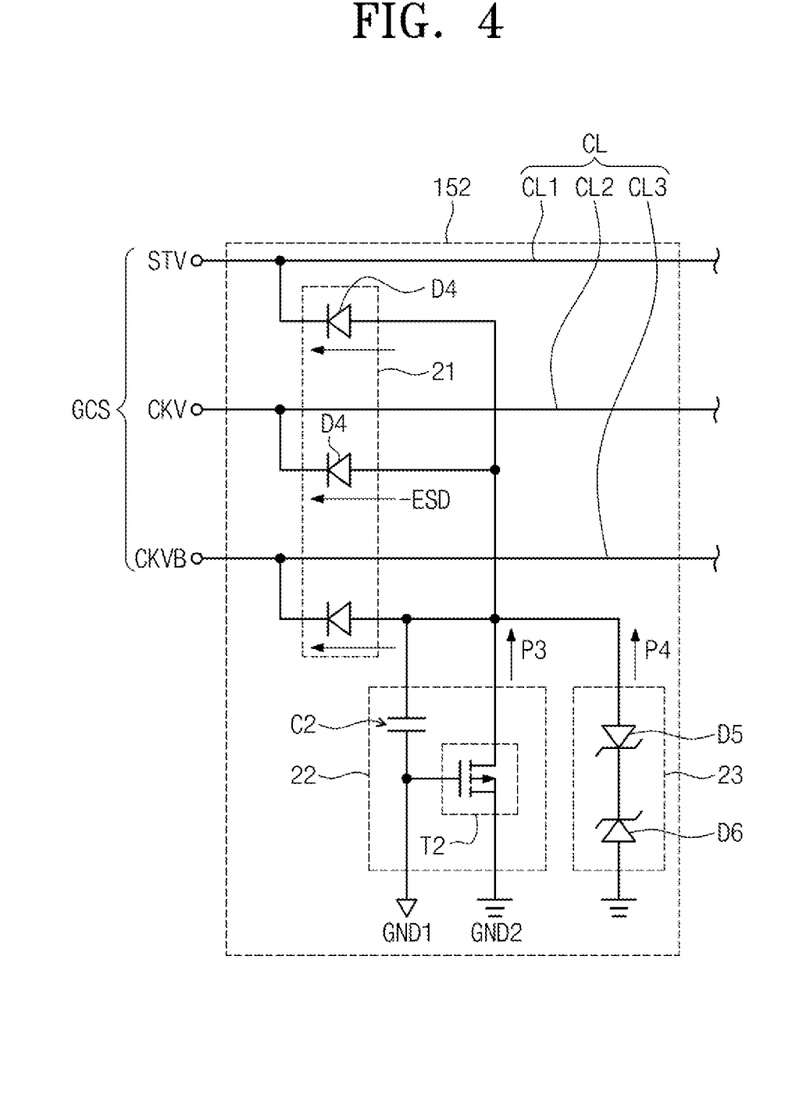
FIG. 4 is a circuit diagram showing an operation of a second static electricity prevention part when a negative static electricity is applied to gate control lines.

FIG. 3 is a circuit diagram showing an operation of the first static electricity prevention part 151 when the positive static electricity is applied to the gate control lines CL1, CL2, and CL3 and FIG. 4 is a circuit diagram showing an operation of the second static electricity prevention part 152 when the negative static electricity is applied to the gate control lines CL1, CL2, and CL3.

Referring to FIGS. 3 and 4, the static electricity includes the positive static electricity +ESD having a voltage level higher than a ground voltage level of the second ground GND2 and the negative static electricity −ESD having a voltage level lower than the ground voltage level of the second ground GND2. As an example, the static electricity may have the voltage level of thousand of kilovolts.

As shown in FIG. 3, when the positive static electricity +ESD is applied to the gate control lines CL1, CL2, and CL3, the positive static electricity +ESD is applied to the first and second static electricity prevention circuits 12 and 13 by the first diode units D1 connected to the gate control lines CL1, CL2, and CL3.

The ground voltage level of the first ground GND1 may he momentarily increased due to the positive static electricity +ESD having a momentary high voltage level. In detail, the positive static electricity +ESD is applied to the first electrode of the first capacitor C1 and the ground voltage of the first ground GND1 is applied to the second electrode of the first capacitor C1. In this case, the ground voltage level of the first ground GND1 is momentarily increased due to a coupling phenomenon between the first and second electrodes of the first capacitor C1.

That is, when a voltage of the first electrode of the first capacitor C1 is momentarily increased up to the high voltage, e.g., the positive static electricity +ESD, a voltage of the second electrode of the first capacitor C1 may he momentarily increased according to the increase in voltage of the first electrode of the first capacitor C1.

Due to the positive static electricity +ESD, the ground voltage level of the first ground GND1 is increased by a predetermined level during a predetermined time. After the time lapses, the ground voltage level of the first ground GND1 returns to its normal ground voltage level.

Due to the increase of the ground voltage level of the first ground GND1, a difference in voltage between the gate electrode and the source electrode of the first transistor T1 has a voltage value enough to turn on the first transistor T1.

When the ground voltage level of the first ground GND1 returns to its normal ground voltage level, the first transistor T1 is turned off since the voltage difference between the gate electrode and the source electrode of the first transistor T1 disappears.

During a time period in which the first transistor T1 is turned on, a first path P1 is formed through the first diode units D1 and the turned-on first transistor T1.

The ground voltage level of the first ground GND1, which is varied according to the coupling phenomenon, is sensitively varied as the size of the second electrode of the first capacitor C1 becomes smaller. In addition, when the ground voltage level is increased, the first transistor T1 is turned on, and thus the first path P1 is formed. The second electrode of the first capacitor C1 is formed by a ground line connected to the first ground GND1.

Accordingly, it is suitable that the size of the ground line connected to the first ground GND1 is smaller than that of other ground lines. As described above, in the present exemplary embodiment, the size of the ground line connected to the first ground GND1 is smaller than the size of the ground line connected to the second ground GND2.

The second and third diode units D2 and D3, each including the zener diode, have a zener voltage of about 30 volts. Therefore, the second and third diode units D2 and D3 are turned on by the positive static electricity +ESD. As a result, a second path P2 is formed by the first diode units D1 and the second and third diode units D2 and D3.

The positive static electricity +ESD is discharged through the first and second paths P1 and P2. That is, the first static electricity prevention part 151 discharges the positive static electricity +ESD through the current paths P1 and P2, which are smaller in number than the number of the gate control lines CL1, CL2, and CL3. Accordingly, the control line CL and the gate driver 130 may be prevented from being damaged due to the positive static electricity +ESD.

The zener voltage of each of the second and third diode units D2 and D3 is greater than the voltage level of the gate control signal GCS. Therefore, when the gate control lines CL1, CL2, and CL3 receive the gate control signal GCS, the third diode unit D3 is turned off.

In addition, the ground voltage level of the first ground GND1, which is varied according to the voltage level of the gate control signal GCS, is not increased to a voltage level enough to turn on the first transistor T1. The ground voltage level of the first ground GND1 may be increased to the voltage level enough to turn on the first transistor T1 by the static electricity with thousand of kilovolts.

Accordingly, when the gate control lines CL1, CL2, and CL3 receive the gate control signal GCS, the first transistor T1 is turned off. As a result, when the gate control lines CL1, CL2, and CL3 receive the gate control signal GCS, the first and second paths P1 and P2 are not formed, and thus the gate control signal GCS is applied to the gate driver 130.

Since a time constant becomes longer as the capacitance of the first capacitor C1 becomes greater, a waveform of the gate control signal GCS may be distorted. When the waveform of the gate control signal GCS is distorted, the gate driver 130 is abnormally operated.

Therefore, in order to reduce the distortion of the gate control signal GCS, the first capacitor C1 is required to have the capacitance smaller than a predetermined capacitance. In the present exemplary embodiment, the first capacitor C1 has the capacitance smaller than about 2.2 nF to allow the gate driver 130 to be normally operated.

In the present exemplary embodiment, since one second static electricity prevention circuit 13 is used to discharge the positive static electricity +ESD, the manufacturing cost of the display apparatus 100 is reduced.

As shown in FIG. 4, when the negative static electricity −ESD is applied to the gate control lines CL1, CL2, and CL3, the negative static electricity −ESD is applied to the third and fourth static electricity prevention circuits 22 and 23 by the fourth diode units D4 connected to the gate control lines CL1, CL2, and CL3.

The negative static electricity −ESD is applied to the first electrode of the second capacitor C2 and the ground voltage of the first ground GND1 is applied to the second electrode of the second capacitor C2. In this case, the voltage of the first electrode of the second capacitor C2 is momentarily decreased by the negative static electricity −ESD, and thus the voltage of the second electrode of the second capacitor C2 may be momentarily decreased in accordance with the decrease of the voltage of the first electrode of the second capacitor C2.

Due to the negative static electricity −ESD, the ground voltage level of the first ground GND1 is decreased by a predetermined level during a predetermined time. After the time lapses, the ground voltage level of the first ground GND1 returns to its normal ground voltage level.

Due to the decrease of the ground voltage level of the first ground GND1, a difference in voltage between the gate electrode and the source electrode of the second transistor T2 has a voltage value enough to turn on the second transistor T2. When the ground voltage level of the first ground GND1 returns to its normal ground voltage level, the second transistor T2 is turned off.

During a time period in which the second transistor T2 is turned on, a third path P3 is formed through the fourth diode units D4 and the turned-on second transistor T2.

The fifth and sixth diode units D5 and D6, each including the zener diode, have a zener voltage of about 30 volts. Therefore, the fifth and sixth diode units D5 and D6 are turned on by the negative static electricity −ESD. As a result, a fourth path P4 is formed by the second diode units D4 and the fifth and sixth diode units D5 and D6.

The negative static electricity −ESD is discharged through the third and fourth paths P3 and P4. That is, the second static electricity prevention part 152 discharges the negative static electricity −ESD through the current paths P3 and P4, which are smaller in number than the number of the gate control lines CL1, CL2, and CL3. Accordingly, the control line CL and the gate driver 130 may be prevented from being damaged due to the negative static electricity −ESD. The zener voltage of each of the fifth and sixth diode units D5 and D6 is greater than the voltage level of the gate control signal GCS. Therefore, when the gate control lines CL1, CL2, and CL3 receive the gate control signal GCS, the sixth diode unit D6 is turned off.

Similar to the first transistor T1, when the gate control lines CL1, CL2, and CL3 receive the gate control signal GCS, the second transistor T2 is turned off. As a result, when the gate control lines CL1, CL2, and CL3 receive the gate control signal GCS, the third and fourth paths P3 and P4 are not formed, and thus the gate control signal GCS is applied to the gate driver 130.

In order to allow the gate driver 130 to be normally operated, the second capacitor C2 has the capacitance smaller than about 2.2 nF.

In the present exemplary embodiment, since one fourth static electricity prevention circuit 23 is used to discharge the negative static electricity −ESD, the manufacturing cost of the display apparatus 100 is reduced.

Consequently, the display apparatus 100 according to the present exemplary embodiment prevents the control line CL and the gate driver 130 from being damaged due to the static electricity and reduces the manufacturing cost.

Figure 5:
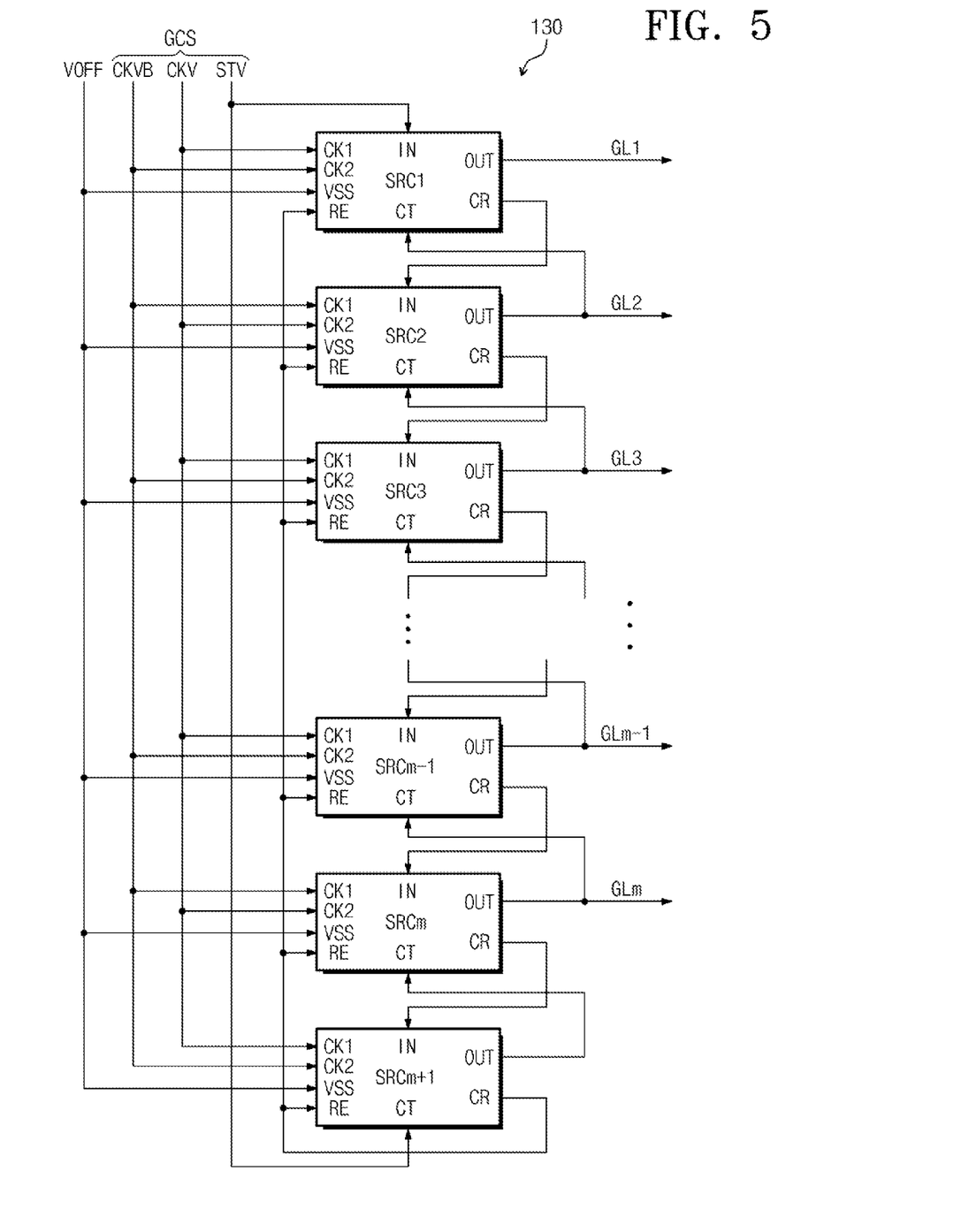
FIG. 5 is a block diagram showing a gate driver shown in FIG. 1.

FIG. 5 is a block diagram showing the gate driver 130 shown in FIG. 1.

Referring to FIG. 5, the gate driver 130 includes first to (m+1)th stages SRC1 to SRCm+1 connected to each other one after another. The first to m-th stages SRC1 to SRCm are electrically connected to the first to m-th gate lines GL1 to GLm to sequentially output the gate signals. The (m+1)th stage SRCm+1 serves as a dummy stage.

Each of the stages SRC1 to SRCm+1 includes a first clock terminal CK1, a second clock terminal CK2, an off voltage terminal VSS, a reset terminal RE, a control terminal CT, a carry terminal CR, an output terminal OUT, and an input terminal IN.

The first and second clock terminals CK1 and CK2 receive clock signals having opposite phases to each other. For instance, the first clock terminals CK1 of odd-numbered stages SRC1, SRC3, . . . , SRCm−1 are applied with a first clock signal CKV and the second clock terminals CK2 of the odd-numbered stages SRC1, SRC3, . . . , SRCm−1 are applied with a second clock signal CKVB having the phase opposite to that of the first clock signal CKV. On the contrary, the first clock terminals CK1 of even-numbered stages SRC2, SRC4, . . . , SRCm are applied with the second clock signal CKVB and the second clock terminals CK2 of the even-numbered stages SRC2, SRC4, . . . , SRCm are applied with the first clock signal CKV.

The input terminal IN of the first stage SRC1 and the control terminal CT of the dummy stage SRCm+1 receive the vertical start signal STV. The input terminals IN of the second to (m+1)th stages SRC2 to SRCm+1 receive a carry signal output from the carry terminal CR of a previous stage. The carry signal output from the carry terminal CR is used to drive a next stage.

The control terminal CT of each of the first to m-th stages SRC1 to SRCm receives the gate signal output through the output terminal OUT of the next stage. The off voltage terminals VSS of the stages SRC1 to SRCm+1 receive an off voltage VOFF. The reset stages RE of the stages SRC1 to SRCm+1 receive the carry signal output from the carry terminal CR of the dummy stage SRCm+1.

When the first and second clock signals CKV and CKVB have the high level, the first and second clock signals CKV and CKVB serve as a gate on voltage to drive the pixels, and when the first and second clock signals CKV and CKVB have the low level, the first and second clock signals CKV and CKVB serve as a gate off voltage.

For instance, the output terminals OUT of the odd-numbered stages SRC1, SRC3, ..., SRCm+1 output a high level period of the first clock signal CKV and the output terminals OUT of the even-numbered stages SRC2, SRC4, ..., SRCm output a high level period of the second clock signal CKVB. The carry terminals CR of the stages SRC1 to SRCm+1 output the carry signal on the basis of the same clock signal as the clock signal output from the output terminal OUT.

Although the exemplary embodiments have been described, it is understood that the inventive concept should not be limited to these exemplary embodiments but various changes and modifications can be made by one ordinary skilled in the art within the spirit and scope of the inventive concept as hereinafter claimed.

What is claimed is:

1. A display apparatus comprising:
    a timing controller configured to output a gate control signal through a plurality of gate control lines;
    a gate driver configured to output gate signals in response to the gate control signal provided from the gate control lines;
    a plurality of pixels configured to receive data voltages in response to the gate signals; and
    first and second static electricity prevention parts connected to the gate control lines in parallel configured to discharge a static electricity, wherein each of the first and second static electricity prevention parts is configured to form current paths, which are smaller in number than a number of the gate control lines, to discharge the static electricity and the static electricity configured to he discharged by the first static electricity prevention part has a polarity different from a polarity of the static electricity configured to be discharged by the second static electricity prevention part.

2. The display apparatus of claim 1, wherein the first static electricity prevention part is configured to discharge the static electricity having a positive polarity.

3. The display apparatus of claim 2, wherein the first static electricity prevention part comprises:
    a first diode part connected to the gate control lines;
    a first static electricity prevention circuit connected to the first diode part; and
    a second static electricity prevention circuit connected to the first diode part, an anode terminal of the first diode part is connected to the gate control lines, and a cathode terminal of the first diode part is connected to the first and second static electricity prevention circuits.

4. The display apparatus of claim 3, wherein the first diode part comprises a plurality of first diode units connected to the gate control lines and the first and second static electricity prevention circuits, an anode electrode of each of the first diode units is connected to a corresponding gate control line among the gate control lines, and a cathode electrode of each of the first diode units is connected to the first and second static electricity prevention circuits.

5. The display apparatus of claim 3, wherein the first static electricity prevention circuit comprises:
    a first capacitor comprising a first electrode connected to the cathode terminal of the first diode part and a second electrode connected to a first ground; and
    a first transistor comprising a gate electrode connected to the first ground, a drain electrode connected to the cathode electrode of the first diode part, and a source electrode connected to a second ground.

6. The display apparatus of claim 5, wherein the first capacitor has a capacitance smaller than about 2.2 nF.

7. The display apparatus of claim 5, wherein the first transistor comprises an n-type field effect transistor.

8. The display apparatus of claim 5, wherein a size of a ground line connected to the first ground is smaller than a size of a ground line connected to the second ground.

9. The display apparatus of claim 8, wherein the first and second grounds are connected to a same ground terminal.

10. The display apparatus of claim 5, wherein the second static electricity prevention circuit comprises a second diode unit and a third diode unit, an anode electrode of the second diode unit is connected to the cathode terminal of the first diode part, a cathode electrode of the second diode unit is connected to a cathode electrode of the third diode unit, and an anode electrode of the third diode unit is connected to he second ground.

11. The display apparatus of claim 10, wherein each of the second and third diode units comprises a zener diode.

12. The display apparatus of claim 11, wherein the gate control signal has a voltage level smaller than a zener voltage of the zener diode.

13. The display apparatus of claim 1, wherein the second static electricity prevention part is configured to discharge the static electricity having a negative polarity.

14. The display apparatus of claim 13, wherein the second static electricity prevention part comprises:
    a second diode part connected to the gate control lines;
    a third static electricity prevention circuit connected to the second diode part; and
    a fourth static electricity prevention circuit connected to the second diode part, an anode terminal of the second diode part is connected to the third and fourth static electricity prevention circuits, and a cathode terminal of the second diode part is connected to the gate control lines.

15. The display apparatus of claim 14, wherein the second diode part comprises a plurality of fourth diode units connected to the gate control lines and the third and fourth static electricity prevention circuits, an anode electrode of each of the fourth diode units is connected to the third and fourth static electricity prevention circuits, and a cathode electrode of each of the fourth diode units is connected to a corresponding gate control line among the gate control lines.

16. The display apparatus of claim 14, wherein the third static electricity prevention circuit comprises:
    a second capacitor comprising a first electrode connected to the anode terminal of the second diode part and a second electrode connected to a first ground; and
    a second transistor comprising a gate electrode connected to the first ground, a drain electrode connected to the anode terminal of the second diode part, and a source electrode connected to a second ground.

17. The display apparatus of claim 16, wherein the second capacitor has a capacitance smaller than about 2.2 nF.

18. The display apparatus of claim 16, wherein the second transistor comprises a p-type field effect transistor.

19. The display apparatus of claim 14, wherein the fourth static electricity prevention circuit comprises a fifth diode unit and a sixth diode unit, an anode electrode of the fifth diode unit is connected to the anode terminal of the second diode part, a cathode electrode of the fifth diode unit is connected to a cathode electrode of the sixth diode unit, and an anode electrode of the sixth diode unit is connected to a second ground.

20. The display apparatus of claim 19, wherein each of the fifth and sixth diode units comprises a zener diode.

* * * * *